United States Patent
Choi et al.

(10) Patent No.: US 7,005,734 B2
(45) Date of Patent: Feb. 28, 2006

(54) DOUBLE-SIDED COOLING ISOLATED PACKAGED POWER SEMICONDUCTOR DEVICE

(75) Inventors: Kang Rim Choi, Cupertino, CA (US); Nathan Zommer, Los Altos, CA (US)

(73) Assignee: IXYS Corporation, Santa Clara, CA (US)

( * ) Notice: Subject to any disclaimer, the term of this patent is extended or adjusted under 35 U.S.C. 154(b) by 29 days.

(21) Appl. No.: 10/430,818

(22) Filed: May 5, 2003

(65) Prior Publication Data

US 2004/0222515 A1    Nov. 11, 2004

(51) Int. Cl.
*H01L 23/02* (2006.01)
(52) U.S. Cl. .................... 257/686; 257/688
(58) Field of Classification Search ............... 257/675, 257/688, 706, 717, 785, 181, 686
See application file for complete search history.

(56) References Cited

U.S. PATENT DOCUMENTS

| | | | |
|---|---|---|---|
| 6,490,161 B1 * | 12/2002 | Johnson | 361/704 |
| 6,693,350 B1 * | 2/2004 | Teshima et al. | 257/712 |
| 6,804,883 B1 * | 10/2004 | Weiblen et al. | 29/854 |
| 2002/0043708 A1 * | 4/2002 | Muto et al. | 257/686 |

\* cited by examiner

*Primary Examiner*—Phat X. Cao
*Assistant Examiner*—Theresa T. Doan
(74) *Attorney, Agent, or Firm*—Townsend and Townsend and Crew LLP

(57) ABSTRACT

A power device includes a semiconductor die having an upper surface and a lower surface. One or more terminals are coupled to the die. A first substrate is bonded to the upper surface of the die. The first substrate is configured to provide a first heat dissipation path. A second substrate is bonded to the lower surface of the die. The second substrate is configured to provide a second heat dissipation path.

18 Claims, 4 Drawing Sheets

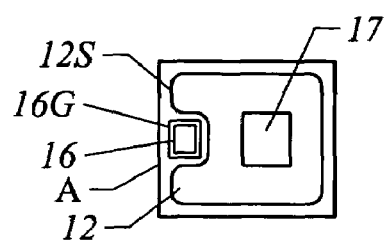
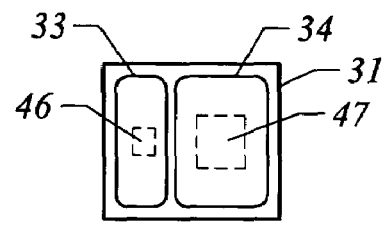
FIG. 4A    FIG. 4C
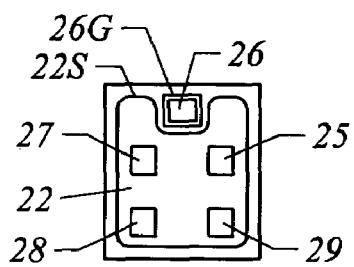
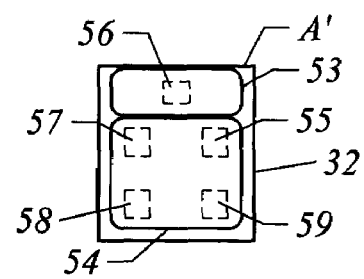
FIG. 4B    FIG. 4D
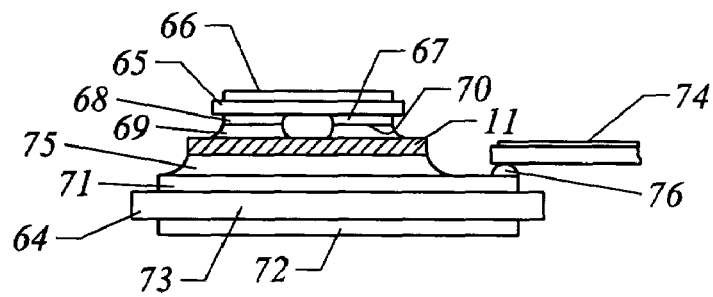
FIG. 5
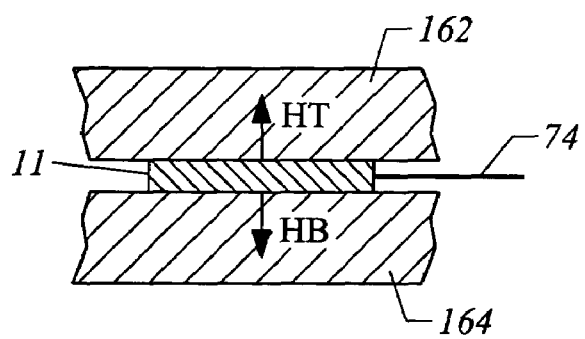
FIG. 6

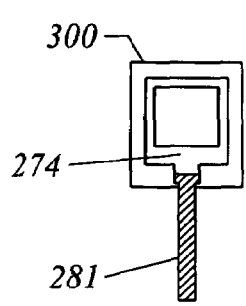
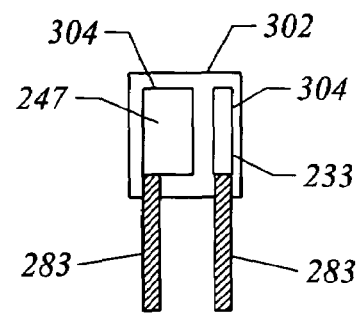
FIG. 8A  FIG. 8B
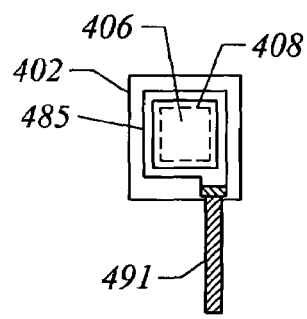
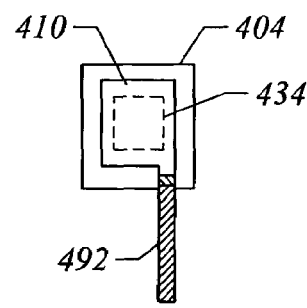
FIG. 9A  FIG. 9B
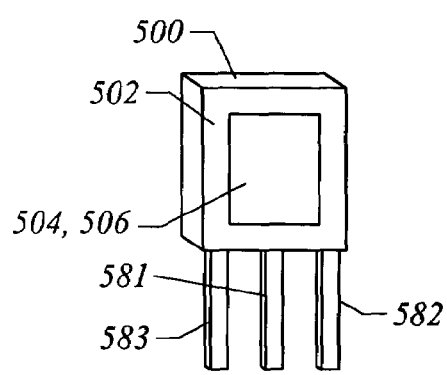
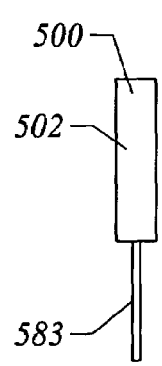
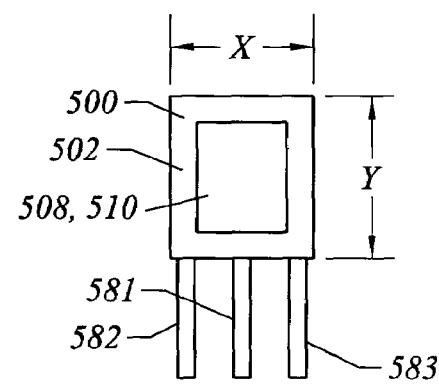
FIG. 10A  FIG. 10B  FIG. 10C

DOUBLE-SIDED COOLING ISOLATED PACKAGED POWER SEMICONDUCTOR DEVICE

BACKGROUND OF THE INVENTION

This invention relates to electronic devices, and more particularly to a packaged power semiconductor device.

Electronic semiconductor device technology continues to rapidly advance, producing devices that achieve heretofore unattainable operating speeds, packing density, and high-temperature compatibility. This last characteristic, high-temperature compatibility, is one of more important features. High-temperature environments as well as high-power and high frequency applications are becoming increasingly important. The ability of electronics to withstand high-temperature environments such as gas-turbines, automotive engine compartments, materials handling and fabrication equipment, and aircraft subsystems makes possible many historically impractical electronic applications for these environments.

Many such high-power, high-temperature electronics applications inherently limit the ability to dissipate heat and power generated by the electronics. Thermal and power management as well as environmental protection of the electronics are therefore handled entirely by the electronics packaging. As a result, typical high-performance packaging criteria include mechanical strength, high thermal conductivity, close matching of device and package thermal expansion coefficients, low dielectric constant for accommodation of high frequency devices, and environmental protection, such as hermetic sealing.

In designing such packages, thermal management is important—especially at high power generation levels which increase the amount of heat created. Heat decreases the performance and operating life of the transistor. Moreover, heat generated at the collector-base junction can create a temperature buildup which may eventually cause the device to short-circuit.

The power device may be mounted on a thermally conductive pad which acts as a heat sink and dissipates the heat generated by the power device. In order to prevent electrical losses, however, the thermally conductive pad provided to be electrically insulating. Hence, a thermally conducting, electrically insulating material, e.g., beryllia (beryllium oxide—BeO) and alumina (aluminum oxide), is used for the mounting pad.

FIG. 1 illustrates a conventional packaged power semiconductor device 10. The device 10 includes a semiconductor chip 11 attached to a base plate or substrate 14, with a solder layer 13, which is usually a highly thermal conductivity metal, e.g., copper or aluminum. The side of the chip 11 that is attached to the metal base plate is generally referred to as a back side of the chip. The top surface of the chip is connected to the leads 16 of the package by wire bonds or clips 12 as shown in FIG. 1.

The top side of the chip has electrical connections and is covered with plastics in a plastic molded package. The combination of the electrical connections and the plastic package provide minimal thermal cooling of the power chip during its operation. Accordingly, the main cooling path for the chip is from its backside via the base plate to an external heatsink 15 attached thereto. This primary heat dissipation path is shown by an arrow H1 in FIG. 1.

BRIEF SUMMARY OF THE INVENTION

Embodiments of the present invention relate to a power device having a new packaging structure that provides effective heat dissipation paths both from the top and bottom of the semiconductor chip.

In one embodiment, a power device includes a semiconductor die having an upper surface and a lower surface. One or more terminals are coupled to the die. A first substrate is bonded to the upper surface of the die. The first substrate is configured to provide a first heat dissipation path. A second substrate is bonded to the lower surface of the die. The second substrate is configured to provide a second heat dissipation path.

In another embodiment, a power semiconductor device includes a semiconductor die; a plurality of terminals coupled to the die; and a dielectric package enclosing the die, the package including a first surface and a second surface, the first surface exposing a first conductive portion configured to provide heat dissipation, the second surface exposing a second conductive portion configured to provide heat dissipation.

In yet another embodiment, a power device includes a semiconductor die including a first surface whereon a source region and a gate region are defined and a second surface whereon a drain region is defined; a first terminal coupled to the source region of the die; a second terminal coupled to the gate region of the die; a third terminal coupled to the drain region of the die; a first substrate attached to the first surface of the die; and a plastic package enclosing the die and at least a first portion of the first substrate, the plastic package exposing a second portion the first substrate, the second portion of the first substrate being a conductive material and configured to dissipate heat generated by the die.

BRIEF DESCRIPTION OF THE DRAWINGS

FIGS. 4A–4D illustrates top and bottom views of directed bonded metal substrates according to one embodiment of the present invention.

FIG. 5 illustrates a cross-sectional view of a power device having two direct bonded metal substrates according to another embodiment of the present invention.

FIG. 6 illustrates a power device attached to two heatsinks according to one embodiment of the present invention.

FIGS. 8A and 8B illustrate top views of directed bonded metal substrates according to one embodiment of the present invention.

FIGS. 9A and 9B illustrate top views of directed bonded metal substrates according to another embodiment of the present invention.

FIGS. 10A–10C illustrate top, side, and bottom views of a power device having two directed bonded metal substrates according to one embodiment of the present invention.

DETAILED DESCRIPTION OF THE INVENTION

Figure 1:
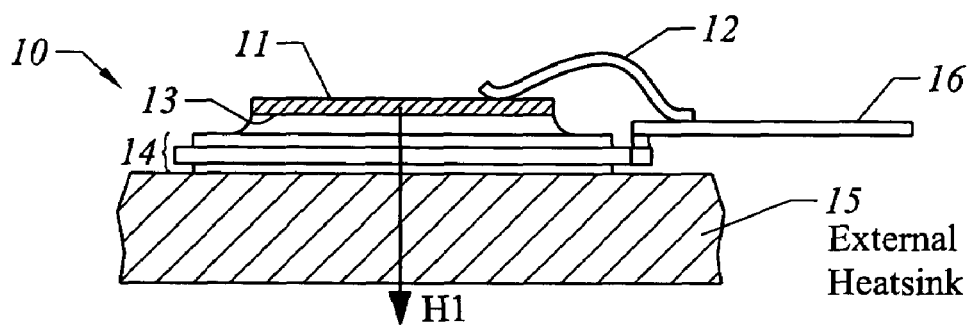
FIG. 1 illustrates a conventional power device attached to a heatsink.
Figure 2:
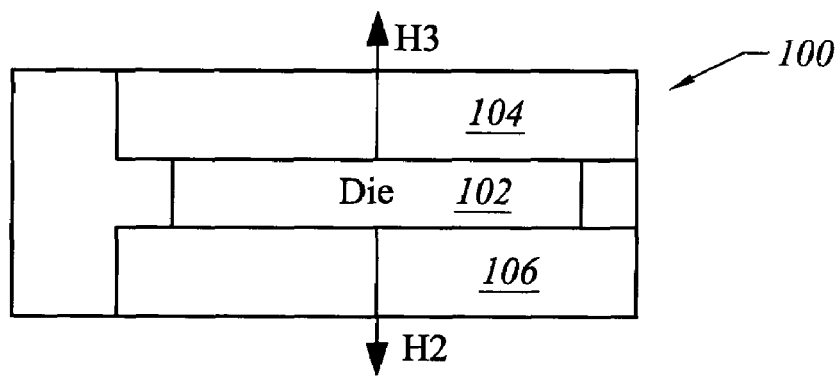
FIG. 2 illustrates a power device including two heat dissipating substrates according to one embodiment of the present invention.

FIG. 2 illustrates a side view of a power semiconductor device 100 according to one embodiment of the present invention. The device includes a semiconductor die 102 and a first substrate 104 provided at the top surface of the die, a second substrate 106 provided at the bottom surface of the die, a package 108, and a plurality of leads (not shown). The substrate comprise conductive material to provide effective heat dissipation. Accordingly, the device 100 is provided with two effective heat dissipation paths, as indicated by arrows H2 and H3 that are pointing upward and downward, respectively.

In one embodiment, the substrates are direct bonded metal substrates. As used herein, the term "direct bonded metal substrate" refers to a substrate comprising a dielectric layer and a conductive layer bonded to each other by heating them to a temperature between the eutectic and melting temperatures of the conductive layer. The conductive layers may be copper, aluminum, or the like. The dielectric layer may be aluminum nitride, alumina, or other ceramic materials. Examples of the direct bonded metal (DMB) substrate includes a direct bonded copper (DCB) or direct copper bonded (DBC) substrate, a direct aluminum bonded (DAB) substrate, and the like. Generally, the direct bonded metal substrate has two conductive layers with a dielectric layer provided therebetween. A more detail description of the direct bonded metal substrate will be provided later.

Compared to solder bonded layers, the direct bonded metal substrates provide superior thermal conductivity due to its "eutectic bond" between the conductive layers and the dielectric layer. The eutectic bonding provides more intimate bonding and eliminates the use of solder which has lower thermal conductivity. Elimination of the use of solder also reduces the thickness of the substrate. In one embodiment, the substrate is about 0.05 inch thick.

Figure 3:
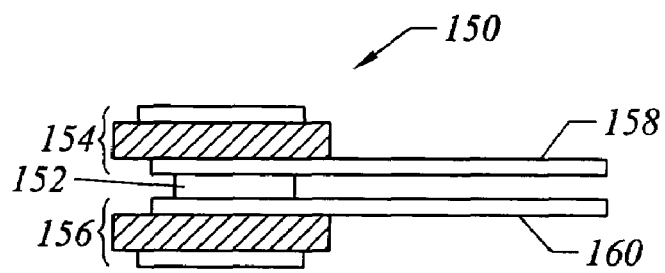
FIG. 3 illustrates a cross-sectional view of a power device having two direct bonded metal substrates according to one embodiment of the present invention.

FIG. 3 illustrates a power device 150 including a die 152, an upper substrate 154 bonded to the top surface of the die, a lower substrate 156 bonded to the bottom surface of the die, a plastic package 157 enclosing the substrates and the die, and a plurality of leads 158 and 160 extending outwardly from the package. The upper substrate 154 is a DAB substrate having a dielectric layer interposed between two aluminum layers. The lower substrate 156 also is a DAB substrate having a dielectric layer interposed between two aluminum layers. The substrate may be DCB substrates in other embodiments. In one embodiment, the lead 158 is coupled to the upper substrate 154, and the lead 160 is coupled to the lower substrate 156.

FIG. 4A illustrates a top view of a semiconductor die 12 having top metallization portions 16G and 12S according to one embodiment of the present invention. FIG. 4B illustrate a top view of a semiconductor die 22 having top metallization portions 26G and 22S according to one embodiment of the present invention. These metallization portions are composed of solderable metal layer and define the areas to which the leads that carry the electrical power and signal to the die are connected. The solderable metal layer refers to a conductive layer that wets any of a given soft solder. The soft solders are standard in the electronics industry. Certain soft solders comprise a combination of lead and tin, or indium tin and silver. The solders preferably have a melting point of less than 400 Celsius. As shown in FIG. 4A, the metallization portions include areas 16 and 17 defining areas where solder may be placed. The die 22 includes areas 25–29 whereon solders may be placed.

Referring to FIGS. 4C and 4D, substrates 31 and 32, e.g., direct-bonded metal substrates, are patterned to match the top surface of the power die. That is, the substrate 31 is patterned to provide conductive islands 33 and 34 to match the patterns of the die 12 for bonding thereto, and the substrate 32 is patterned to provide conductive islands 53 and 54 to match the patterns of the die 22 for bonding thereto. The areas of solder on the surface of the substrate 31 that are to be bonded or joined to the die 12 are designated as areas 46 and 47. These areas are bonded to the areas 16 and 17, respectively. Similarly, the areas of solder on the surface of the substrate 32 that are to be bonded or joined to the die 22 are designated as areas 55–59. These areas are configured to be bonded to the areas 25–29, respectively.

The area of solder or solderable metalization can be of various geometrical patterns to accommodate the ratings and design needs of the power device according to its application. Also in some application, it is desirable to passivate the metal area of the DMB substrate that is not covered with the solder with a special polymer or dielectric coating for bonding to the corresponding top surface of the die. This passivation on the metal area of the DMB substrate is to prevent voltage shorting or flashover for high voltage power devices.

FIG. 5 illustrates a cross-sectional view of a first DMB substrate 65 bonded to the upper surface of a die 11 and a second DMB substrate 66 bonded to the lower surface of the die according to one embodiment of the present invention. FIG. 5 is drawn primarily to illustrate the vertical structure and is not drawn to scale.

The first DMB substrate 65 includes an upper conductive layer, a lower conductive layer, and a dielectric layer provided therebetween. The upper conductive layer and the lower conductive layer have substantially the same surface area. The dielectric layer has a slightly larger surface area than the upper or lower conductive layer to ensure electrical isolation of the two conductive layers, as explained in U.S. patent application Ser. No. 10/099,061, filed on Mar. 12, 2002, which is assigned to the Assignee of the present application and is incorporated by reference.

The lower conductive layer includes a first conductive island 67 and a second conductive island 68 that have been patterned to correspond to the patterns of the upper surface of the die 11. These islands are soldered to the top surface of the power die 11. A solder 69 bonds the island 68 to the gate pad of the die, and a solder 70 bonds the island 67 to the source pad of the die according to one embodiment of the present invention.

The second DMB substrate 64 includes an upper conductive layer 71, a lower conductive layer 72, and a dielectric layer 73 provided therebetween. The upper conductive layer and the lower conductive layer have substantially the same surface area. The dielectric layer has a slightly larger surface area than the upper or lower conductive layer to ensure electrical isolation of the two conductive layers.

The power die 11 is soldered to the upper conductive layer 71 of the substrate 64. That is, the drain or backside of the die 11 is bonded to the upper conductive layer 71 using a solder 75. A lead 72 is bonded, using a solder 76, to a portion of the upper layer 71 to form an electrical coupling with the drain of the die. Accordingly, the die 11 is attached to two conductive layers, i.e., the upper surface 66 of the first substrate and the lower surface 72 of the second substrate, to dissipate the heat generated during device operation. In one embodiment, a first heatsink 162 is coupled to the upper surface 66 and a second heat sink 164 is coupled the lower surface 72 (FIG. 6).

In one embodiment, the DMB substrates 64 and 65 are provided with different sizes to differentiate the upper and lower sides of the die 11. For example, the first substrate 65 is provided to be smaller than the second substrate 64. Alternatively, the two substrates may be provided to be the same size.

Figure 7A:
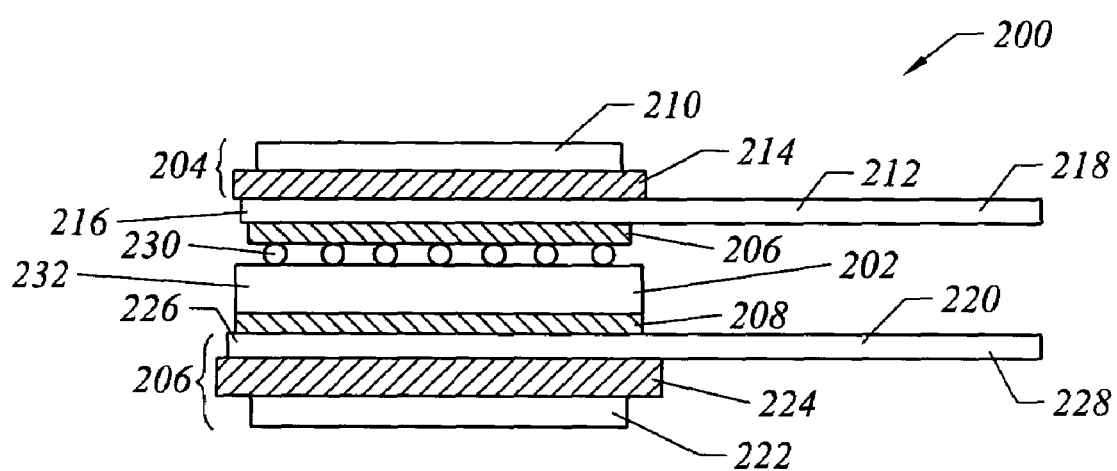
FIG. 7A illustrates a cross-sectional view of a power device provided with a plurality of bumps to raise at least one of the direct bonded metal substrates according to one embodiment of the present invention.

FIG. 7A illustrates a power MOSFET device 200 having two heat dissipation paths according to one embodiment of the present invention. The device includes a die 202 bonded to an upper substrate 204 using a solder 206 and a lower substrate 206 using a solder 208.

The substrates are DMB substrates in the present embodiment. The upper substrate 204 includes an upper conductive layer 210, a lower conductive layer 212, and a dielectric layer 214 provided therebeteween. The lower conductive layer includes a first portion 216 that is configured to be bonded to the solder 206 and a second portion 218 that is configured to be one or more leads, e.g., two leads that are coupled to the source and gate of the die 202. That is, the lower layer 212 is patterned to provide the first and second portions 216 and 218. Alternatively, the lower layer 212 may not comprise the second portion 218; rather, a lead portion corresponding to the second portion is bonded to the lower layer 212.

Similarly, the lower substrate 206 includes an upper conductive layer 218, a lower conductive layer 220, and a dielectric layer 222. The upper layer 218 includes a first portion 226 that is configured to be bonded to the solder 208 and a second portion 228 that is configured to be a lead coupled to a drain of the die. That is, the upper layer 220 is patterned to provide the first and second portions 226 and 228. Alternatively, a lead portion corresponding to the second portion may be bonded to the upper layer 220 rather being patterned from the upper conductive layer.

Figure 7B:
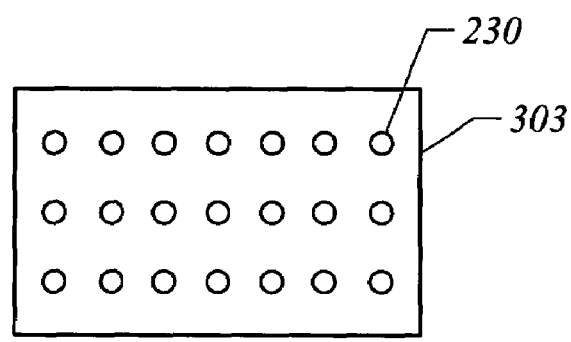
FIG. 7B illustrates a top view of a die provided with a plurality of bumps according to one embodiment of the present invention.

The device 200 includes a plurality of conductive bumps 230 provided between the solder 206 and the die 202 to raise the upper substrate a given distance from the upper surface of the die 202. The bumps are provided to prevent accidental shorting of the lower conductive layer 212 of the upper substrate to a side 232 (or the drain) of the die. In one embodiment, a plurality of bumps are also provided between the lower substrate and the die. FIG. 7B illustrates a top of the die 202 provided with the plurality of bumps 230. The bumps may be made from the lead and tin. In one embodiment, the bump includes about 37% Pb and 63% Sn.

FIGS. 8A and 8B illustrate top views of a first DMB substrate 300 and a second substrate 302 according to one embodiment of the present invention. The first substrate 300 corresponds to the lower substrate 206 of the device 200 in FIG. 7A, and the second substrate 302 corresponds to the upper substrate 204 of the device 200.

The first substrate 300 includes a conductive layer 274 that is bonded to the drain of a die and a drain lead 281. The lead 281 may be patterned from the conductive layer 274 or bonded to the layer 274. The second substrate 302 includes a conductive layer 304 that comprises a first conductive island 247 and a second conductive island 233. The first conductive island is configured to be bonded to the source of the die and is electrically coupled to a source lead 282. The second conductive island is configured to be bonded to the gate of the die and is electrically coupled to a gate lead 283. The first and second islands are patterned from the conductive layer 304. The source and gate leads may be patterned from the conductive layer 304 at the time the first and second islands are patterned. Alternatively, the source and gate leads may be formed by bonding conductive leads to the first and second islands. In one embodiment, the drain lead 281 is provided between the source and gate leads when the substrates 300 and 302 are bonded to the die.

In other embodiment, all the leads may be provided on the first substrate 300 or the second substrate 302 to connect the power die to an external electrical circuit. Alternatively, two leads are provided on the second substrate, and one lead is provided on the first substrate. For devices with more than three terminals, additional combinations can be utilized for improved performance and/or reduced cost, and/or flexibility in designs. That is, the use of the two substrates provides an added degree of freedom to the designer.

The design of the leads can be made in a manner that brings the leads to a co-linear pattern, where they extend along a straight line, or in any other pattern on a printed circuit board. The leads and the package can also be formed to fit surface mount device (SMD) pattern for SMD manufacturing process.

FIGS. 9A and 9B illustrate a power device having a two terminals or leads, e.g., a diode, according to one embodiment of the present invention. The power device includes a lower substrate 402 and an upper substrate 404. A diode chip 406 is mounted on a metal layer 485 of the lower substrate 402. A first lead 491 is coupled to the metal layer 485, thereby being coupled to the back side of the chip. The upper substrate 404 includes a metal layer 434 that is bonded to the upper side of the chip 406. A second lead 492 is coupled to the metal layer 434, thereby being coupled to the top side of the chip. Areas 408 and 410 represented by broken lines are provided to receive solders for bonding the substrate to the chip.

FIGS. 10A–10C illustrate various views of the a power device 500 according to one embodiment of the present invention. FIG. 10A shows a top view of the power device including a plurality of leads 581, 582, and 583. The device has a plastic package 502 enclosing a single die (not shown). An upper conductive layer 504 of an upper DMB substrate 506 that is bonded to the top surface of the die is exposed to effectively dissipate heat generated by the die during the device operation. The upper conductive layer is provided to be flushed with or be at level surface with an upper package surface to enable a first heat sink (not shown) to be attached to the upper conductive layer. Alternatively, the upper conductive layer may be raised slightly above the upper package surface.

FIG. 10C shows a bottom view of the power device 500. A lower conductive layer 508 of the lower DMB substrate 510 is exposed to effectively dissipate heat generated by the die during the device operation. The lower conductive layer is provided to be flushed with a lower package surface to enable a second heat sink (not shown) to be attached thereto. Alternatively, the lower conductive layer may be raised slightly above the lower package surface. In one embodiment, the lower conductive layer has a greater exposed surface area than the upper conductive layer to provide a means of identifying the upper and lower side of the die. Alternatively, the lower conductive layer may be provided with a smaller exposed surface area than the upper conductive layer or a marking may be placed on the device to provide proper orientation of the device.

In one embodiment, the exposed lower conductive layer 508 has an area that is at least 50 percent of the area of the lower surface of the device, preferably at least 70 percent, more preferably at least 85 percent, where the area of the lower surface of the device is X times Y. The exposed upper conductive layer 504 has an area that is at least 50 percent of the area of the upper surface of the device, preferably, at least 60 percent, more preferably at least 75 percent, where the area of the upper surface of the device is X times Y. FIG. 10B shows a side of the power device 500 according to one embodiment of the present invention. The conductive layers 504 and 508 are not shown since they are flushed to the package surfaces according to the present embodiment.

Referring back to FIG. 7A, the substrates 204 and 206 are bonded to the die 202 using soft solder technology. The DMB substrates may have their corresponding leadframes as parts of their structures. In one embodiment, the leadframes and the power die are attached to the corresponding top DMB substrate and the bottom DMB substrate in a single soldering step. In another embodiment, the leadframes and power die are bonded to the substrates in two step soldering process if the device has more than three terminal. For example, the leadframes are bonded to the DMB substrates, and then the power die is bonded to the DMB substrates. The solder used for bonding the leadframes to the substrates preferably has a higher melting point than that used for bonding the die to the substrates.

Thereafter, the substrates and die are encapsulated in a plastic package using a molding process. The device takes a shape as illustrated in FIGS. 10A–10C in one embodiment. The device may be configured to conform to TO-220, TO-247, TO-264 and their equivalent SMD versions. Smaller package outlines are also possible, like the SOT package family.

Although the present embodiments have been illustrate primarily using a power MOSFET, the present invention may be applied to an IGBT, SCR, diode, and the like. The present invention has been illustrated using specific embodiments above. Accordingly, the scope of the present invention is defined by the appended claims.

What is claimed is:

1. A power device, comprising:
a semiconductor die having an upper surface and a lower surface;
one or more terminals coupled to the die;
a first substrate bonded to the upper surface of the die, the first substrate being configured to provide a first heat dissipation path; and
a second substrate bonded to the lower surface of the die, the second substrate being configured to provide a second heat dissipation path,
wherein the first and second substrates have substantially the same surface area,
wherein the second substrate is a directed bonded metal substrate, the second substrate including a first conductive layer, a second conductive layer, and a first dielectric layer provided between the first and second conductive layers.

2. The device of claim 1, further comprising:
a plastic package enclosing the die, the package including a first main surface and a second main surface, the second main surface exposing a first conductive portion configured to dissipate heat generated by the die during the power device operation.

3. The device of claim 2, wherein the first main surface of the package exposes a second conductive portion configured to dissipate heat generated by the die during the power device operation.

4. The device of claim 3, wherein the first main surface is an upper surface of the package and the second main surface is a lower surface of the package.

5. The device of claim 4, wherein the first substrate is a direct bonded metal substrate, the first substrate including a third conductive layer, a fourth conductive layer, and a second dielectric layer provided between the third and fourth conductive layers.

6. The device of claim 1, wherein the device includes one and only one semiconductor die.

7. The device of claim 1, wherein the device is configured to be attached to first and second heatsinks, the first heatsink being configured to be attached to the first substrate and the second heatsink being configured to be attached to the second substrate.

8. A power device, comprising:
a semiconductor die having an upper surface and a lower surface;
one or more terminals coupled to the die;
a first substrate bonded to the upper surface of the die, the first substrate being configured to provide a first heat dissipation path;
a second substrate bonded to the lower surface of the die, the second substrate being configured to provide a second heat dissipation path; and
a plastic package enclosing the die, the package including a first main surface and a second main surface, the second main surface exposing a first conductive portion configured to dissipate heat generated by the die during the power device operation,
wherein the second substrate is a direct bonded metal substrate, the second substrate including a first conductive layer, a second conductive layer, and a first dielectric layer provided between the first and second conductive layers, and
wherein the first exposed conductive portion is the second conductive layer of the second substrate.

9. The device of claim 8, wherein the first main surface of the package exposes a second conductive portion configured to dissipate heat generated by the die during the power device operation.

10. The device of claim 9, wherein the first main surface is an upper surface of the package and the second main surface is a lower surface of the package.

11. The device of claim 10, wherein the first substrate is a direct bonded metal substrate, the first substrate including a third conductive layer, a fourth conductive layer, and a second dielectric layer provided between the third and fourth conductive layers.

12. The device of claim 8, wherein the device includes one and only one semiconductor die.

13. The device of claim 8, wherein the device is configured to be attached to first and second heatsinks, the first heatsink being configured to be attached to the first substrate and the second heatsink being configured to be attached to the second substrate.

14. The device of claim 8, wherein the first and second substrates are direct bonded metal substrates, the first substrate including a first conductive layer, a second conductive layer, and a first dielectric layer provided therebetween, the second substrate including a third conductive layer, a fourth conductive layer, and a second dielectric layer provided therebetween, the second conductive layer being bonded to the upper surface of the die, the third conductive layer being bonded to the lower surface of the die, the device further comprising:

a plurality of bumps provided between the second conductive layer and the die to raise the second conductive layer away from the die.

15. The device of claim 8, wherein the first and second substrates are direct bonded metal substrates, the first substrate including a first conductive layer, a second conductive layer, and a first dielectric layer provided therebetween, the second substrate including a third conductive layer, a fourth conductive layer, and a second dielectric layer provided therebetween, the second conductive layer being bonded to the upper surface of the die, the third conductive layer being bonded to the lower surface of the die, wherein second conductive layer includes the one or more terminals that have been formed by patterning the second conductive layer.

16. A power device, comprising:

a semiconductor die having an upper surface and a lower surface;

one or more terminals coupled to the die;

a first substrate bonded to the upper surface of the die, the first substrate being configured to provide a first heat dissipation path; and a second substrate bonded to the lower surface of the die, the second substrate being configured to provide a second heat dissipation path, wherein the first and second substrates have substantially the same surface area, wherein the first and second substrates are direct bonded metal substrates, the first substrate including a first conductive layer, a second conductive layer, and a first dielectric layer provided therebetween, the second substrate including a third conductive layer, a fourth conductive layer, and a second dielectric layer provided therebetween, the second conductive layer being bonded to the upper surface of the die, the third conductive layer being bonded to the lower surface of the die, the device further comprising:

a plurality of bumps provided between the second conductive layer and the die to raise the second conductive layer away from the die.

17. A power device, comprising:

a semiconductor die having an upper surface and a lower surface;

one or more terminals coupled to the die;

a first substrate bonded to the upper surface of the die, the first substrate being configured to provide a first heat dissipation path; and a second substrate bonded to the lower surface of the die, the second substrate being configured to provide a second heat dissipation path, wherein the first and second substrates have substantially the same surface area, wherein the first and second substrates are direct bonded metal substrates, the first substrate including a first conductive layer, a second conductive layer, and a first dielectric layer provided therebetween, the second substrate including a third conductive layer, a fourth conductive layer, and a second dielectric layer provided therebetween, the second conductive layer being bonded to the upper surface of the die, the third conductive layer being bonded to the lower surface of the die, and wherein second conductive layer includes the one or more terminals that have been formed by patterning the second conductive layer.

18. A power device, comprising:

a semiconductor die having an upper surface and a lower surface;

one or more terminals coupled to the die;

a first substrate bonded to the upper surface of the die, the first substrate being configured to provide a first heat dissipation path; and a second substrate bonded to the lower surface of the die, the second substrate being configured to provide a second heat dissipation path, wherein the first and second substrates have substantially the same surface area, and wherein the first and second substrates are direct bonded metal substrates, each including a first conductive layer, a second conductive layer, and a first dielectric layer provided between the first and second conductive layers.

* * * * *